United States Patent [19]

Deffendall et al.

[11] 4,337,456
[45] Jun. 29, 1982

[54] ANALOG TO DIGITAL CONVERTER WITH OFFSET ERROR CORRECTION

[75] Inventors: George W. Deffendall, Reading; James J. Hitt, Willow Grove, both of Pa.

[73] Assignee: Leeds & Northrup Company, North Wales, Pa.

[21] Appl. No.: 30,197

[22] Filed: Apr. 16, 1979

[51] Int. Cl.³ .......................................... H03K 13/20
[52] U.S. Cl. .................... 340/347 NT; 340/347 AD; 340/347 CC
[58] Field of Search .... 340/347 M, 347 NT, 347 AD, 340/347 CC

[56] References Cited

U.S. PATENT DOCUMENTS

| | | |
|---|---|---|
| 3,872,466 | 3/1975 | Wold .......................... 340/347 NT |
| 3,942,173 | 3/1976 | Wold .......................... 340/347 NT |
| 4,023,160 | 5/1977 | Kirschner .................... 340/347 NT |

*Primary Examiner*—Charles D. Miller
*Attorney, Agent, or Firm*—William G. Miller, Jr.; Raymond F. MacKay

[57] ABSTRACT

An analog to digital converter of the ramp-integrator type with provisions to reduce errors due to offset voltages. The cycle which is utilized includes a preconditioning cycle during which the capacitor is charged while the input to the buffer amplifier is connected to the datum level voltage, such as ground. A microprocessor is used to compute the unknown signal.

3 Claims, 2 Drawing Figures

ANALOG TO DIGITAL CONVERTER WITH OFFSET ERROR CORRECTION

BACKGROUND OF THE INVENTION

This invention relates to analog to digital converters and more particularly to analog to digital converters having means for compensating for offset errors so as to provide for an accurate conversion. The invention is particularly adaptable to analog to digital conversion in those applications where a microcomputer is used since the conversion incorporates the microcomputer to select the voltages applied to the integrating circuitry and to provide the counting or timekeeping function of the converter.

Analog to digital converters of various types have been in use for many years. Among the converters most frequently used is the dual slope analog to digital converter such as described, for example, in U.S. Pat. No. 3,051,939. Improvements have been made in the dual slope analog to digital converter to incorporate provisions for compensating for the offset error and to provide for bipolar operation without zero discontinuity as shown, for example, in U.S. Pat. No. 3,872,466 as well as the Continuation-in-Part of that patent, namely U.S. Pat. No. 3,942,173. In these patents, a linear integrator is operated through two successive cycles to effect the analog to digital conversion. In the first of these two cycles, an error signal is derived representing the total error producing offset voltage present in the system. In the second cycle, the unknown analog signal is converted to a corresponding digital output signal by an arrangement which corrects the digital output for the error component previously determined in the first cycle. The correction is accomplished by determining the integrating period during which the unknown voltage is integrated so that the time period for that integration is modified in accordance with the magnitude of the error signal detected during the first cycle.

Another approach to correction for the offset error is disclosed in U.S. Pat. No. 4,023,160 which also includes two cycles but which does not utilize the determination during the error signal measuring cycle to determine the duration of the integration of the unknown during the second cycle. Instead, this reference utilizes a counter which counts in one direction during the discharge portion of the first cycle and that counter is then utilized to count in the opposite direction during the discharge portion of the second cycle so that the net count resulting is intended to provide a digital signal corresponding to the analog signal with compensation for offset error. This latter method of error compensation will not, however, compensate for the effect of the error signal on both the charging and discharging of the integrator as is the case with the previous references mentioned. Likewise, the arrangement shown in U.S. Pat. No. 4,023,160 does not carry out the integration only on one side of the predetermined datum voltage level. Therefore, the arrangement of U.S. Pat. No. 4,023,160 is subject to errors resulting from variations in the response of the converter component such as the comparator used as a zero crossing detector, whereas in the arrangement of U.S. Pat. Nos. 3,872,466 and 3,942,173, as in the present invention, the integrator is operated so as to carry out the integration only on one side of a predetermined datum voltage level with the functioning of the converter to be the same for input analog signals of either polarity and with no special means needed to provide for sensing the input polarity and for switching the converter circuitry accordingly as in conventional bipolar converters of the dual slope type. Thus, the single sided integration operation of those two references is carried out in such a way that the ramp approach to and the intersection with the datum level always is from the same direction, and always is at the same slope. The conversion operation is started in response to the detection of the integrator output crossing the datum level, such as ground level, from that same direction and slope so that errors due to varying response time in the comparator for determining when that level is arrived at will not be variable.

It will be evident that none of the prior art references correct for long term changes in offset currents and voltages which result in span shifts.

It is an object of the present invention to avoid the complexities of the prior art analog to digital converters described above, by providing a converter which will correct for offset errors which vary during long term operation as, for example, due to temperature and time thus correcting for the resulting span shift. The invention also provides a means whereby analog to digital conversion can be carried out with a minimum of components and with the least expensive components. The present invention is particularly applicable in those applications where a microcomputer is to be used for computational purposes other than those required as part of the analog to digital converter. Other objects and advantages of the invention will become evident from the following description considered together with the accompanying drawings.

SUMMARY OF THE INVENTION

The present invention is a method for producing a digital signal of value indicative of the value of an unknown analog voltage. This method employs a charge storage device coupled to the output of a current converter of the type which produces offsetting currents in the charge storage device. The method comprises as its first step the application of a datum level voltage to the input of the current converter for a first predetermined time period, which time period is equal to a constant times another or second predetermined time period. The datum level voltage is applied to the current converter so that during the period when it is applied a charging current flow through said storage device. That charging current will be of magnitude depending upon the magnitude of the unknown analog voltage plus the magnitude of the offsetting current which produce an offsetting voltage across the storage device. The application of the datum level voltage to the current converter changes the voltage across the storage device from a first voltage level such as the datum level to a second voltage level. At the end of the predetermined period during which the datum level voltage is applied to the current converter, the charge storage device is discharged at a known rate by the application of the voltage reference to the input of the converter for the time required to change the voltage across the storage device from the second level back to the first level. There is then applied to the current converter the unknown analog voltage for the second predetermined time period so as to charge the device in response to the charging current due to both the unknown analog current and the offsetting currents. As a result, the device is charged to a third level and at the end of the second predetermined time period is discharged at the known rate by the application of the reference potential for the time required to change the voltage across the storage device back to the first level. There is then produced a digital signal from the value of the ratio of the duration of the period it took to discharge from the third level to the first level as compared to the period used to charge from the first level to the third level. That ratio is corrected for the value of the offsetting currents by the reduction of the numerator by the value of the period it took to discharge from the second level to the first level divided by the constant and the denominator is corrected by increasing the value of the denominator by the same amount as was used to decrease the numerator.

DESCRIPTION OF THE PREFERRED EMBODIMENT

Figure 1:
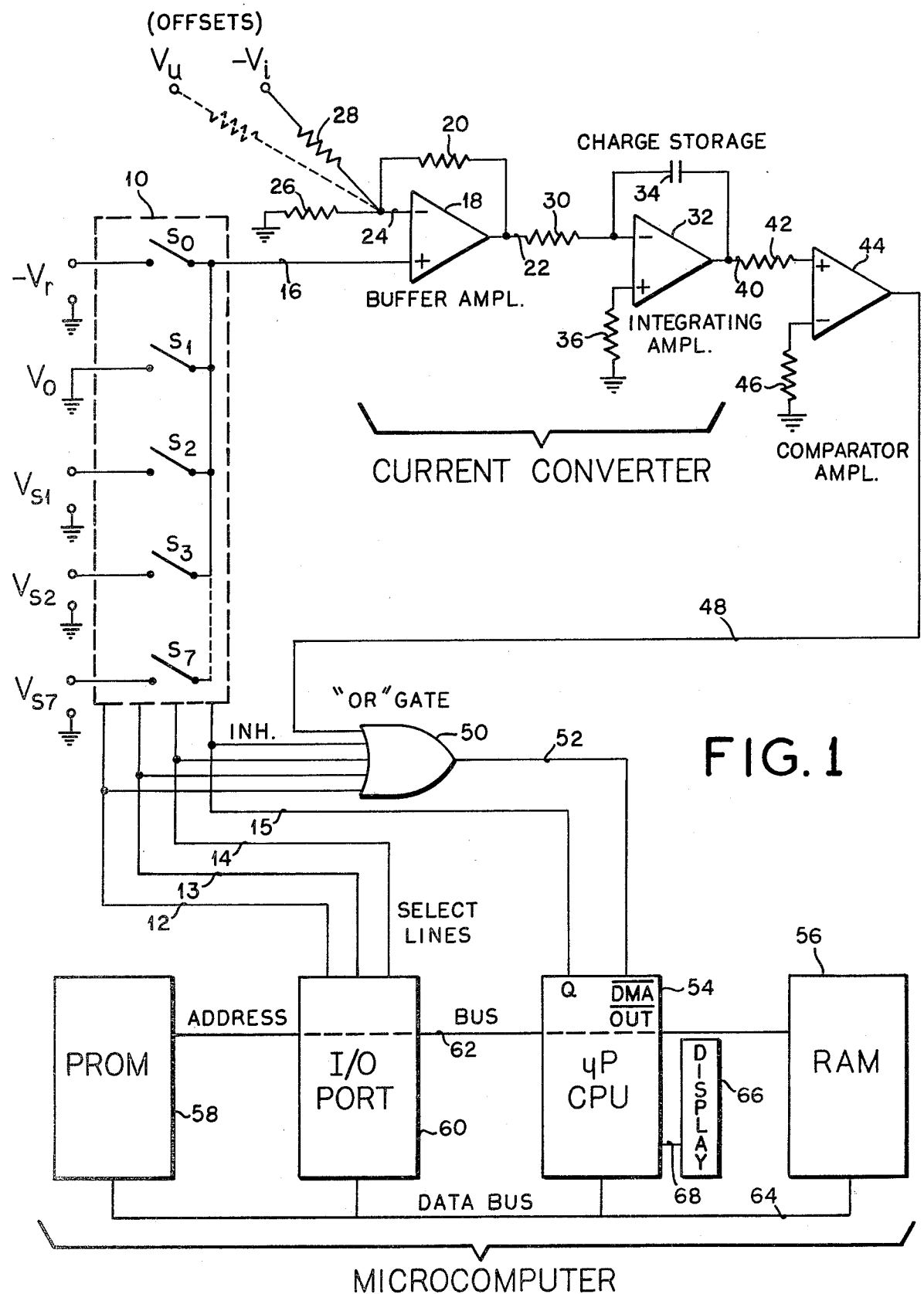
FIG. 1 is a block diagram of the analog to digital converter and the microcomputer utilized for making the conversion in conjunction with associated analog components.

In FIG. 1 there is shown an analog to digital conversion circuit which includes a microcomputer. In this combination there is shown a multiplexing input switch 10 which is shown as having eight selectively operated switches $S_0$, $S_1$, $S_2$, $S_3$, through $S_7$ which can be selectively actuated in accordance with the signals provided on the select lines 12-14 which provides signals to the multiplexing switch 10 for selectively actuating the appropriate switch in the proper time sequence as determined by the program of the microcomputer.

The switches $S_0$-$S_7$ respectively provide for the connection of analog voltages to be converted. For example, a negative reference voltage $V_r$ is connected by switch $S_0$, while a datum level voltage $V_0$, which is shown in FIG. 1 at ground potential, is connected by switch $S_1$. The switches $S_2$ and $S_3$ respectively connect unknown analog voltages $V_{S1}$ and $V_{S2}$ respectively so that those two unknown voltages can be converted to digital signals. The remaining switches $S_4$, $S_5$, $S_6$ and $S_7$ can likewise be connected to unknown analog voltages but for purposes of this description will not be discussed further.

The output line 16 from the multiplex switch 10 is connected to the noninverting input of the differential amplifier 18 which forms a part of the buffer amplifier shown as including a feedback resistor 20 for connecting its output line 22 to the inverting input at line 24. The inverting input of amplifier 18 is also connected to ground potential by way of resistor 26 and it is in addition connected to the intentionally applied offset voltage $-V_i$ by a resistor 28. An offset voltage which is unintentional in that it results from transistor bias currents, is shown as $V_u$ which can for theoretical purposes be assumed to be applied through resistor 29, shown in phantom, to input line 24. As a result of the negative offset voltage $-V_i$, the output of the buffer amplifier on line 22 is always offset from the input on line 16 by a magnitude corresponding to $V_i$, so that when the input on line 16, for example, is at ground potential, the output line 22 is at a potential $+V_iG$ where G is the gain of the buffer amplifier circuit. Preferably $V_i$ is of sufficient magnitude so that when an analog voltage to be converted is applied to line 16 its magnitude will not exceed that of $V_i$ thus providing bipolar operation without crossing zero.

The output of the buffer amplifier is connected by way of resistor 30 to the inverting input of differential amplifier 32 which is shown as having a feedback capacitor 34 so that amplifier 32 in combination with the feedback capacitor 34 forms an integrating amplifier. It will be noted that the noninverting input of amplifier 32 is connected to ground by way of resistor 36.

The buffer amplifier circuit and the integrating amplifier circuit taken together make up the current converter which converts the analog voltage connected to the input of the buffer amplifier to a current in the capacitor 34. It is well known that the circuitry of the buffer amplifier and the integrating amplifier will normally be such that small inadvertent bias currents will flow, causing an offset which is unintentional whereas the offset provided by the potential $-V_i$ connected to resistor 28 provides an intentional offset. The currents through the capacitor 34 resulting from both the intentional and unintentional offsets serve to cause an error in the analog to digital conversion which requires correction for accurate conversion to be accomplished. Thus, if for example we denote the inadvertent or unintentional offset voltages as $V_u$, and the intentional offset voltages as $V_i$, then we can represent the net offset voltages which appear across capacitor 34 and hence causes an offset current to charge capacitor 34 as "e" which is then equal to the sum of the unintentional and the intentional offset, namely $V_u + V_i$.

The output of the integrating amplifier on line 40 is connected by way of resistor 42 to the noninverting input of amplifier 44, which is comparator amplifier. The inverting input of the amplifier is connected by way of resistor 46 to ground so that the comparator amplifier will provide an output signal on its output line 48 whenever the output from the integrating amplifier on line 40 becomes decreasingly negative in potential so that it reaches the datum level or ground potential. In the arrangement shown, when the potential of line 40 reaches ground potential, the signal on line 48 becomes a positive going signal which is introduced as one input to the "or" gate 50 which will in turn provide a positive signal on the output line of "or" gate 50, namely line 52.

A positive signal on line 52 at the output of "or" gate 50 also occurs whenever a positive signal is provided on the select lines 12, 13, or 14, or when a positive signal is provided on the inhibit line 15, all of which are connected as inputs to the gate 50.

The appearance of a positive signal on line 52 is effective in the microprocessor CPU 54 to stop the counting which is carried out whenever the signal on line 52 is low, namely whenever the signal to the $\overline{\text{DMA OUT}}$ terminal of 54 is low. As can be seen from FIG. 1, the output signal from the terminal Q of the microprocessor CPU 54 on line 15 provides an inhibit signal which is effective to preclude the counting in the microprocessor also.

As shown in FIG. 1, the microcomputer consists of a microprocessor CPU identified by reference numeral 54, in addition to a random access memory 56, as well as a programmable read-only memory 58 and an input-output port 60. Those four elements are connected together by means of an address bus 62 and also by means of a data bus 64. There is also provided and connected to the microprocessor 54, a display 66 which is the digital display which provides the digital output which results from the conversion of the arrangement of FIG. 1. Thus, the purpose of the apparatus of FIG. 1 is to convert the analog voltages $V_{S1}$ and $V_{S2}$ to corresponding digital signals on line 68 as inputs to the display 66 so that the voltages $V_{S1}$ and $V_{S2}$ can be digitally displayed in the display 66, as well as being utilized in the microcomputer for various calculations as may be necessary, depending upon the purpose for which the microcomputer is to be used, that is, depending upon the calculations it is designed to carry out which utilize the magnitudes of the voltages $V_{S1}$ and $V_{S2}$.

Figure 2:
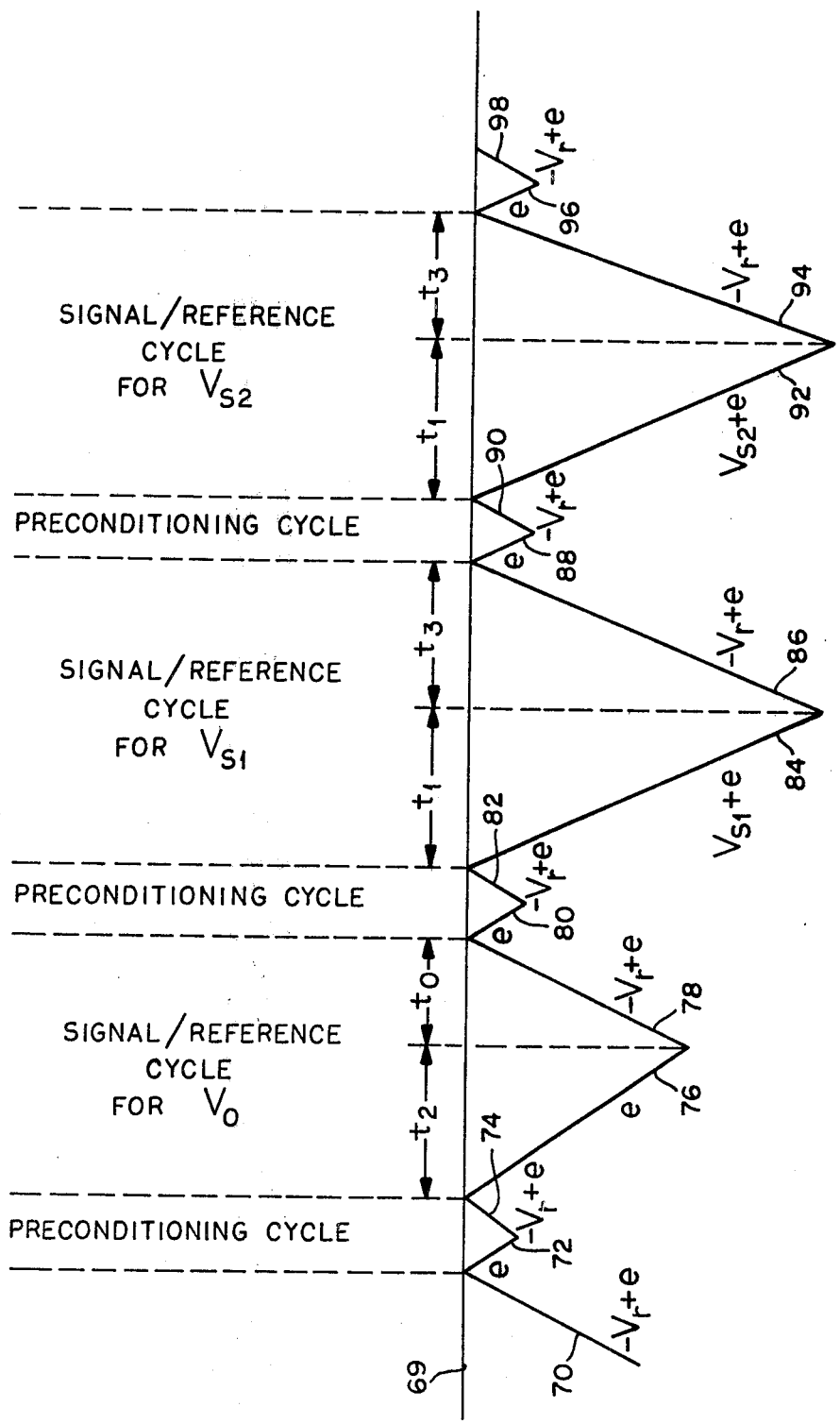
FIG. 2 is a timing diagram showing the time relationship between various events during the conversion operation.

The timing diagram of FIG. 2 shows the relationship between the various portions of the conversion cycle.

If we assume that the horizontal line 69 of FIG. 2 represents the datum level voltage as, for example, a ground level, the initial part of the cycle for conversion requires that the potential of the output line 40 of FIG. 1 which is graphically shown in FIG. 2 and which corresponds to the magnitude of the voltage across the capacitor 34 and hence the magnitude of the charging current through that capacitor must be initially reduced from whatever negative potential it may be at to the datum level by the application of the negative voltage $V_r$ through the switch $S_0$ to the buffer amplitude, thus the segment 70 of the timing diagram shows the potential at output line 40 of FIG. 1 becoming less negative and approaching ground potential by virtue of the connection of switch $S_0$ which is effective to apply across the capacitor 34 a potential directly related to $-V_r+e$ by the gain G of the current converter circuit.

Since the discharging part of the conversion cycle is always carried out by the application of the voltage $V_r$ and to that voltage there is always added the effect of the net offset voltage e which is here shown as being subtracted from $V_r$, the potential of line 40 always approaches ground at the same rate. When the potential at output line 40 reaches ground potential, the comparator amplifier will cause an output signal to be produced on line 48 which will be effective through the "or" gate 50 and its output line 52 to cause the microcomputer to stop counting and cause the select lines 12-14 to switch the multiplexing switch 10 so that the select lines 12-14 cause the multiplexing switch 10 to connect the voltage $V_0$ through switch $S_1$ to the input of the buffer amplifier so that the only potential which is effectively charging the capacitor 34 is the net offset voltage e as shown on segment 72 of FIG. 2.

The segment 72 may be considered the charging segment of the preconditioning cycle. That segment has a duration which is of magnitudes in accordance with the requirements for resetting various elements of the microcomputer and preparing for the conversion operation. The segment 72 is terminated whenever sufficient time has elapsed for any resetting or initialization of the microcomputer. Then the discharge part of the preconditioning cycle is initiated so that during segment 74 the potential on the output line 40 from the integrating amplifier is reduced to ground potential by the connection of the voltage $V_r$ through switch $S_0$ just as was done on segment 70. When the potential on line 40 reaches ground potential, the microcomputer then is operable in response to a signal on line 52 to cause the select lines to connect switch $S_1$ again.

This time the connection of $S_1$ is made for the purpose of determining the magnitude of the offset voltages and the currents associated therewith. Thus, the first phase of the signal/reference cycle for $V_0$, which is considered to be at ground potential, is shown as segment 76 which is the charging segment of that cycle with the slope of the charging segment being in accordance with the net offset voltage e. The charging segment is carried out over a time period $t_2$ which is a predetermined time period. That time period is counted out by the microcomputer and more specifically by the timing operation in the central processing unit 54 so that at the end of the period $t_2$ the select lines to the multiplexing switch 10 are effective to disconnect the switch $S_1$ and connect the switch $S_0$ so as to discharge the capacitor 34 during the discharge segment 78 while permitting the $\overline{DMA\ OUT}$ input to go low until the potential on line 40 reaches ground potential at the end of the period $t_0$. The duration of the period $t_0$ will, of course, depend upon the sum of the offsetting voltages which is a magnitude corresponding with e.

Thus, as is typical with dual slope analog to digital conversion, the charging cycle has a fixed duration and a variable slope depending upon the analog voltage being converted and the discharge cycle has a fixed slope and a variable duration with the duration being indicative of the magnitude of the voltage being converted, since all of the charge accumulated by the capacitor 34 during the period $t_2$ must be discharged during the period $t_0$. The magnitude of $t_0$ is then indicative of the net offset voltage e and that time period is put in the memory of the microcomputer for future use. Whenever the segment 78 is terminated by the potential at output line 40 of the integrating amplifier reaching ground potential, the select lines are then effective by virtue of the output of the microcomputer to cause a connection of the switch $S_1$ to again go through a preconditioning cycle which will again allow for a resetting of the counters and a preconditioning of the microcomputer for the next cycle of the analog to digital converter. Thus, the segments 80 and 82 are segments similar to those identified as 72 and 74 respectively, since they are the charging and discharging phases of the preconditioning cycle. After the segment 82 has been terminated by the potential on line 40 reaching ground potential, the microcomputer is then effective through the signals on the select line 12-14 to connect the switch $S_2$ in the multiplexing switch unit 10, so as to connect to the input line 16 of the buffer amplifier a potential $V_{S1}$ which is one of the unknown analog voltages to be converted to a digital signal for display and to be utilized in the microcomputer for future calculations. Thus, the segment 84 of the timing diagram of FIG. 2 has a slope which corresponds with the sum of the unknown analog voltage $V_{S1}$ and the net offset voltage e and the duration of segment 84, namely $t_1$, is a predetermined duration which may be equal to the duration of the period $t_2$ unless the voltages $V_{S1}$ and e are sufficiently different as to require different charging periods for the two cycles.

At the end of the period $t_1$, the microcomputer is effective to cause the select lines 12-14 to select in the multiplexing switch unit 10 a switch $S_0$ so that the capacitor 34 is discharged at the known rate represented by $V_r$-e. There is then measured by the microcomputer the duration of the period $t_3$ required to discharge the capacitor 34 until the potential on line 40 reaches ground potential. In utilizing the apparatus of FIG. 1 to make the conversion from analog to digital, the period $t_3$ may be measured indirectly as by determining the number of counts on the counter in the microprocessor CPU 54 or, as is preferred in the arrangement of FIG. 1, the period $t_3$ may be corrected by effectively subtracting from the period $t_3$ the magnitude of the period $t_0/k$. This can be accomplished by setting the counter in the microprocessor at a value corresponding to $-t_0/k$ at the beginning of the segment 86 so that at the end of that segment the counter will contain a count corresponding to $t_3-t_0/k$.

As will be evident from the derivation shown in the Appendix, the unknown voltage $V_{S1}$, for example, can be calculated by the microcomputer using values in accordance with the appropriate one of the following equations:

$$V_S = V_r \left[ \frac{t_3 - t_0/k}{t_1 + t_0/k} \right] \tag{1}$$

where $t_2 = kt_1$ $$V_S = kV_r \left| \frac{t_3 - t_0/k}{t_2 + t_0} \right| \tag{2}$$

Thus, at the end of segment 86 the numerator of the fraction in the above equation (2), for example, is stored in the counter in the central processing unit, and it is only necessary then to multiply that value by the reciprocal of the quantity $t_2+t_0$. Thus, the reciprocal of the quantity $t_2+t_0$ is computed by the microcomputer and the necessary multiplication carried out in accordance with the program in the microcomputer. The result is then proportional to the voltage $V_{S1}$.

The operation of the arrangement of FIG. 1 proceeds then to make a conversion of the analog voltage $V_{S2}$ to a digital signal. This is carried out by a sequence similar to that for converting the voltage $V_{S1}$ in that the conversion goes through a preconditioning cycle as shown by segments 88 and 90 which corresponds to a preconditioning cycle shown by segments 80 and 82. That preconditioning cycle is then followed by a signal/reference cycle for $V_{S2}$ which includes the segment 92 during which period the switch 10 has the switching element $S_3$ connected so that the capacitor 34 is charged in accordance with the sum of the unknown voltage $V_{S2}$ and the net offset voltage $e$. That charging of the capacitor during segment 92 is carried out for the period $t_1$ which in this case may be assumed to be different than $t_2$. For example, $t_2$ may be considered to be twice as great as $t_1$. Thus $k=2$ and the microcomputer then causes the switch 10 to have the switching element $S_0$ connected for purposes of discharging the capacitor along the segment 94 so that the period required for discharging the capacitor 34, namely the period $t_3$ for this conversion cycle, is indicative of the magnitude of the voltage $V_{S2}$. The value of $V_{S2}$ will be in accordance with equations (1) or (2) with the value of k considered to be 2. The numerator of the fraction in equations (1) or (2) can be determined as in the calculation for $V_{S1}$ with the added requirement that the presetting of the counter be in accordance with twice the value of $t_0$.

The segment 94 is followed by another preconditioning cycle consisting of segments 96 and 98 which are similar to the preconditioning cycles previously mentioned so that the counters in the microcomputer may be reset and the other elements of the microcomputer may be prepared for the subsequent operations which may include various computations required to get the desired use from the converted values of $V_{S1}$ and $V_{S2}$. Thus, it will be evident that the microcomputer in this particular apparatus, as shown in FIG. 1, is utilized for a portion of the time to carry out or to assist in carrying out, the analog to digital conversion of unknown analog voltages needed for subsequent computations so that the remainder of the time available to the microcomputer is utilized for those computations. By this arrangement it is evident that the number of components required for the analog to digital conversion is minimized since the microcomputer itself takes part in the conversion.

The units that make up the microcomputer may be commercially available ones. For example, the CPU may be an RCA CD1802, the RAM an RCA CD1824, the PROM an INTEL 2716, the I/O PORT an RCA CD1852, and the switch an RCA CD4051. The programming required to carry out the functions mentioned above is within the ordinary skill of those familiar with microcomputers since the program is simple in nature using ordinary methematical computations and techniques to perform the required analog to digital conversion.

APPENDIX

Since the charge taken out of the storage device must equal that put in $$-t_0[-V_r + e] = et_2 \tag{1}$$

then $$t_0 = \frac{-et_2}{-V_r + e} \tag{2}$$

and $$e = \frac{t_0 V_r}{[t_2 + t_0]} \tag{3}$$

also $$t_3 = \frac{-(V_S + e)t_1}{-V_r + e} \tag{4}$$

then $$-t_3 = \frac{V_S t_1}{-V_r + e} + \frac{et_1}{-V_r + e} \tag{5}$$

assuming $$t_2 = kt_1 \tag{6}$$

rewriting (2) in terms of $t_1$ $$-\frac{t_0}{ke} = \frac{t_1}{-V_r + e} \tag{7}$$

substituting for $\frac{t_1}{-V_r + e}$ in (5)

$$t_3 = \left[ \frac{V_S t_0}{ke} + \frac{t_0}{k} \right] \tag{8}$$

rewriting (3) in terms of $t_1$ $$e = \frac{t_0 V_r}{[kt_1 + t_0]} \tag{9}$$

substituting for $e$ in (8)

$$t_3 = \frac{V_S[kt_1 + t_0]}{kV_r} + \frac{t_0}{k} \tag{10}$$

then $$t_3 = \frac{V_S[t_1 + t_0/k]}{V_r} + \frac{t_0}{k} \tag{11}$$

solving (11) for $V_S$ $$V_S = V_r \left[ \frac{t_3 - t_0/k}{t_1 + t_0/k} \right] \tag{12}$$

which can also be written as

-continued
APPENDIX $$V_S = kV_r \left[ \frac{t_3 - t_0/k}{t_2 + t_0} \right] \quad (13)$$

What is claimed is:

1. A method for producing a digital signal of value indicative of the value of an unknown analog voltage which employs a charge storage device coupled to the output of a current converter of the type which produces offsetting currents in said device comprising the steps of:

applying a datum level voltage $V_O$ to the input of said current converter for a predetermined time period $t_2$ which is equal to a constant k times a predetermined time period $t_1$ whereby during said period the charging current in said device due to said voltage and the offsetting current produce a voltage across said storage device which changes from a first voltage level to a second voltage level;

discharging said device at a known rate by the application of a reference voltage $V_r$ to the input of said converter for the time $t_0$ required to change the voltage across said storage device from said second back to said first level;

applying said unknown analog voltage $V_S$ to the input of said current converter for said predetermined time period $t_1$ measured from the time the voltage across said device is at said first level, whereby during said period the charging current in said device due to said unknown analog voltage and the offsetting currents produces a change in the voltage across said device to a third level;

discharging said device at said known rate by the application of the reference potential $V_r$ to the input of said converter for the time $t_3$ required to change the voltage across said storage device from said third level back to said first level; and producing said digital signal to have a value proportional to the reference voltage times the ratio of the period $t_3$ to the period $t_1$ as corrected for the value of said offsetting currents by the reduction of the value of $t_3$ by an amount $t_0/k$ and the increase of the value $t_1$ by an amount $t_0/k$ where k equals $t_2/t_1$.

2. A method for producing a digital signal of value indicative of the value of an unknown analog voltage which employs a charge storage device coupled to the output of a current converter of the type which produces offsetting currents in said device comprising the steps of:

applying a datum level voltage $V_o$ to the input of said current converter for a predetermined time period $t_2$ whereby during said period the charging current in said device due to said voltage and the offsetting current produce a voltage across said storage device which changes from a first voltage level to a second voltage level;

discharging said device at a known rate by the application of a reference voltage $V_r$ to the input of said converter for the time $t_0$ required to change the voltage across said storage device from said second back to said first level;

storing the value $t_0$;

applying said unknown analog voltage $V_S$ to the input of said current converter for said predetermined time period $t_1$, equal to $t_2/k$, measured from the time the voltage across said device is at said first level, whereby during said period the charging current in said device due to said unknown analog voltage and the offsetting currents produce a change in the voltage across said device to a third level;

discharging said device at said known rate by the application of the reference potential $V_r$ to the input of said converter for the time $t_3$ required to change the voltage across said storage device from said third level back to said first level;

storing the value $t_3$; and producing from said stored values of $t_0$ and $t_3$ said digital signal to have a value proportional to the reference potential $V_r$ times the value of the ratio of $t_3 - t_0/k$ to $t_2 + t_0$ to correct for the effect of said offsetting currents on the magnitude of the digital signal.

3. An analog to digital converter comprising:

an integrating amplifier forming a charge storage means;

a buffer amplifier connected to the input of said integrating amplifier, said buffer amplifier operating to combined selected voltage signals with an offset voltage to produce in said charge storage means currents representing the values of said combined signals;

switching means for selectively connecting to the input of said buffer amplifier input voltages respectively of value representing an unknown being measured, a reference magnitude, and a datum level;

a comparator amplifier coupled to the output of said integrating amplifier for producing an output signal therefrom when the output of said charge storage means arrives at said datum level;

control and counting means including a microcomputer for responding to the output signal of said comparator amplifier to operate said switching means so as to connect said input voltages to said buffer amplifier in the following sequence and for the time periods indicated (a) said datum level voltage for the period required to condition the microcomputer for subsequent steps, (b) said reference voltage until an output signal is received from said comparator amplifier (c) said datum level voltage for a predetermined period $t_2$, (d) said reference voltage for a period $t_0$ until an output signal is received from said comparator amplifier, (e) said datum level voltage for the period required to condition the microcomputer for subsequent steps, (f) said reference voltage until an output signal is received from said comparator amplifier (g) said unknown voltage $V_S$ for a predetermined period $t_1$, and then (h) said reference voltage $V_r$ for a period $t_3$ until an output signal is received from said comparator amplifier;

timing the duration of said predetermined periods $t_1$ and $t_2$, counting the times $t_0$ and $t_3$ during which the reference voltage is selected until said datum level is reached;

calculating the unknown voltage in accordance with the following equation, $$V_S = -kV_r \left[ \frac{t_3 - t_0/k}{t_2 + t_0} \right],$$

where $k = t_2/t_1$.

* * * * *